US009989613B2

(12) United States Patent
Wiens et al.

(10) Patent No.: US 9,989,613 B2
(45) Date of Patent: Jun. 5, 2018

(54) SYSTEM AND METHOD FOR EXTERNALLY CALIBRATED PARALLEL IMAGING IN THE PRESENCE OF AN INHOMOGENEOUS MAGNETIC FIELD

(71) Applicant: Wisconsin Alumni Research Foundation, Madison, WI (US)

(72) Inventors: Curtis N. Wiens, Middleton, WI (US); Nathan S. Artz, Bartlett, TN (US)

(73) Assignee: WISCONSIN ALUMNI RESEARCH FOUNDATION, Madison, WI (US)

( * ) Notice: Subject to any disclaimer, the term of this patent is extended or adjusted under 35 U.S.C. 154(b) by 855 days.

(21) Appl. No.: 14/558,374

(22) Filed: Dec. 2, 2014

(65) Prior Publication Data

US 2016/0154080 A1 Jun. 2, 2016

(51) Int. Cl.
*G01V 3/00* (2006.01)
*A61B 5/05* (2006.01)
*G01R 33/565* (2006.01)
*G01R 33/24* (2006.01)
*G01R 33/483* (2006.01)
*G01R 33/561* (2006.01)

(52) U.S. Cl.
CPC ..... *G01R 33/56536* (2013.01); *G01R 33/246* (2013.01); *G01R 33/483* (2013.01); *G01R 33/5611* (2013.01)

(58) Field of Classification Search
CPC ............ G01R 33/56536; G01R 33/246; G01R 33/5611; G01R 33/483
USPC .................................. 324/309, 318; 600/410
See application file for complete search history.

(56) References Cited

U.S. PATENT DOCUMENTS

2013/0281822 A1* 10/2013 Graziani ................ A61B 5/055
600/410

* cited by examiner

*Primary Examiner* — Farhana Hoque
(74) *Attorney, Agent, or Firm* — Quarles & Brady LLP

(57) ABSTRACT

A system and method for accelerated magnetic resonance imaging (MRI) includes controlling an RF system of an MRI system to acquire coil calibration data from a subject including a material causing inhomogeneities in a static magnetic field of the MRI system when arranged in the bore of the MRI system. After acquiring the coil calibration data, the RF system is controlled to acquire imaging data from the subject at multiple different resonance frequency offsets. The spectral bin images relate specific resonance frequencies to distinct spatial locations in the static magnetic field of the MRI system. An image of the subject is reconstructed from the imaging data using coil calibration data and the spectral bin data to provide spatial encoding of the image.

20 Claims, 6 Drawing Sheets

SYSTEM AND METHOD FOR EXTERNALLY CALIBRATED PARALLEL IMAGING IN THE PRESENCE OF AN INHOMOGENEOUS MAGNETIC FIELD

STATEMENT REGARDING FEDERALLY SPONSORED RESEARCH

N/A

BACKGROUND OF THE INVENTION

The present disclosure relates to systems and methods for magnetic resonance imaging (MRI). More particularly, the present disclosure relates to systems and methods for improved parallel imaging, particularly, in the presence of an inhomogeneous magnetic field.

Magnetic resonance imaging (MRI) of non-ferrous metallic implants is challenging because of the substantial inhomogeneity induced in the $B_0$ magnetic field of the MRI system. This inhomogeneity makes signal excitation difficult and leads to severe off-resonance in nearby tissue and distorts conventional spatial-encoding mechanisms. The image artifacts resulting from the off-resonance can significantly degrade the diagnostic quality of an image, making clinical diagnoses in the presence of metal very challenging.

Methods such as view angle tilting (VAT), slice-encoding for metal artifact correction (SEMAC), and multi-acquisition variable-resonance image combination (MAVRIC) have been developed in an attempt to mitigate the off-resonance artifacts surrounding metallic implants. These methods are described, for example, by K. M. Koch, et al., in "Magnetic Resonance Imaging Near Metal Implants," *J Magn Reson Imaging*, 2010; 32(4):773-787.

Due to safety and hardware limitations, a single radio frequency (RF) pulse is often incapable of exciting the wide range of frequencies near metal. To cover this broad spectrum of frequencies, methods such as MAVRIC utilize multiple acquisitions, each with an RF pulse at different resonance frequency offsets. Therefore each acquisition produces images with a unique spectral sensitivity pattern. These "spectral" images can then be combined to generate a composite image with the combined signal images acquired at the different frequencies. Although MAVRIC is capable of mitigating artifacts caused by large perturbations in the $B_0$ field, it requires long scan times and is, thereby, limited in spatial resolution.

In addition to lengthy scan times, MAVRIC also utilizes a frequency-encoding (readout) gradients, which fundamentally limits its ability to eliminate in-plane signal loss and pile-up. While VAT and Jacobian methods help reduce in-plane signal loss and pile-up errors near metal, signal loss is unavoidable when the local $B_0$ gradient within a voxel exceeds the readout gradient, such as in tissue directly adjacent to a metal object, such as described in Koch, K. M., King, K. F., Carl, M. and Hargreaves, B. A. (2014), Imaging near metal: The impact of extreme static local field gradients on frequency encoding processes. Magn Reson Med, 71: 2024-2034. doi: 10.1002/mrm.24862, which is incorporated herein by reference in its entirety.

Single point imaging (SPI) techniques encode k-space one point at a time by eliminating frequency-encoding gradients and have been previously proposed in an effort to produce distortion-free images in the presence of off-resonance. This effort, however, has not gained traction because of prohibitively long scan times associated with SPI methods. A recent SPI method that is capable of spectrally-resolved, purely phase-encoded three-dimensional acquisitions was recently proposed, as described in co-pending U.S. patent application Ser. No. 13/451,773, filed on Apr. 20, 2012, entitled "System and Method for Spectrally-Resolved Three-Dimensional Magnetic Resonance Imaging Without Frequency-Encoding Gradients," and which is herein incorporated by reference in its entirety. Similar to MAVRIC, this new spectrally-resolved purely phase-encoded technique can utilize multiple acquisitions each with an RF pulse at different center frequency offsets, to cover a broad spectrum of frequencies new metal. However acquiring multiple acquisitions can increase scan time even further.

Thus, there remains a need for a system and method for magnetic resonance imaging that is capable of accelerating data acquisitions in the presence of severe off-resonances, such as those caused by magnetic field inhomogeneities induced by a metallic object.

SUMMARY OF THE INVENTION

The invention described in the present disclosure overcomes the aforementioned drawbacks by providing a system and method for efficiently measuring coil sensitivities across a broad off-resonance spectrum, enabling the use of externally calibrated PMRI techniques. The present disclosure provides systems and methods for accelerated magnetic resonance imaging that permits undersampled acquisitions and accelerates the overall imaging process by utilizing an external calibration process. That is, the present disclosure provides a system and method that can use a single, calibration acquisition to significantly reduce acquisition times by eliminating the need to acquire fully sample calibration regions for all of the acquisitions at different resonance frequency offsets.

In accordance with one aspect of the present disclosure, a magnetic resonance imaging (MRI) system is disclosed that includes a magnet system configured to generate a static magnetic field about at least a bore of the MRI system, a plurality of gradient coils configured to apply a gradient field to the static magnetic field, and a radio frequency (RF) system including an array of coils configured to apply an excitation field and acquire MR image data therefrom. The system also includes a computer system configured to control the RF system to acquire coil calibration data from a subject including a material causing inhomogeneities in the static magnetic field when arranged in the bore of the MRI system. After acquiring the coil calibration data, the computer system is configured to control the RF system to acquire imaging data with from the subject and analyze the imaging data to generate spectral bin data with respect to a plurality of spectral bins. The spectral bin data relates specific resonance frequencies to distinct spatial locations in the static magnetic field of the MRI system. The computer system is further configured to reconstruct an image of the subject from the imaging data using the coil calibration data and the spectral bin data to provide spatial encoding of the image for each spectral bin.

In accordance with another aspect of the present disclosure, a method is provided for acquiring imaging data from multiple different resonance frequency offsets with a magnetic resonance imaging (MRI) system. The method includes acquiring coil calibration data using a coil array positioned for imaging with respect to a subject having a material causing inhomogeneities in a static magnetic field of the MRI system. The method also includes separately from acquiring the coil calibration data, acquiring imaging data from the subject across a plurality of different resonance frequency offsets corresponding to respective spectral bins. The method further includes deriving spectral bin images from the imaging data, wherein the spectral bin images relate specific resonance frequencies to distinct spatial locations in the static magnetic field of the MRI system and reconstructing an image of the subject from the imaging data using coil calibration data and the spectral bin images to provide spatial encoding of the image.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
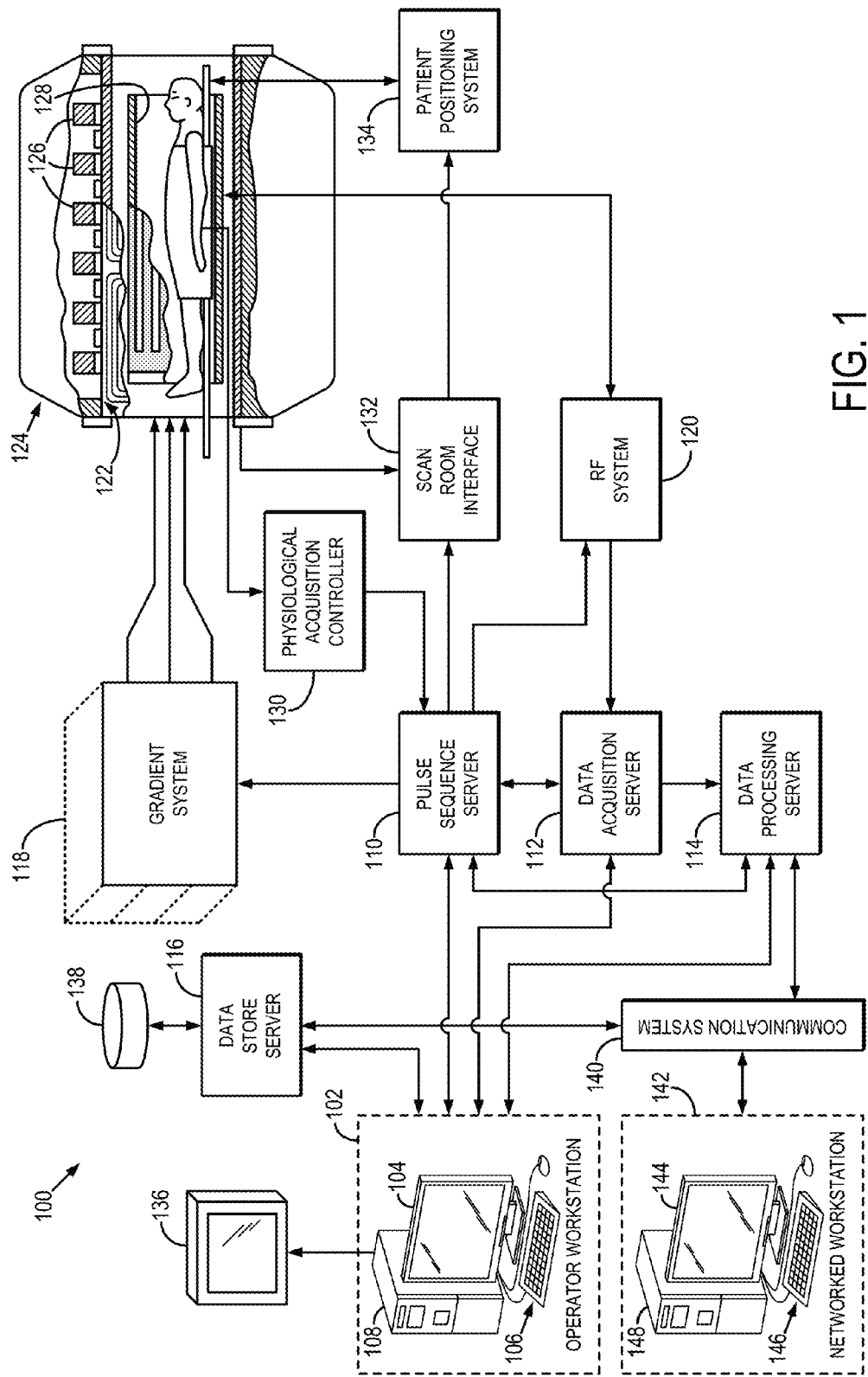
FIG. 1 is a block diagram illustrating an example of a magnetic resonance imaging system for use in accordance with the present disclosure.

Referring to FIG. 1, an example of a magnetic resonance imaging (MRI) system 100 is illustrated. The MRI system 100 includes an operator workstation 102, which will typically include a display 104; one or more input devices 106, such as a keyboard and mouse; and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency (RF) system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil (not shown in FIG. 1), are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 328 or to one or more local coils or coil arrays (not shown in FIG. 1).

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \tag{1};$$

and the phase of the received magnetic resonance signal may also be determined according to the following relationship:

$$\varphi = \tan^{-1}\left(\frac{Q}{I}\right). \tag{2}$$

The pulse sequence server 110 also optionally receives patient data from a physiological acquisition controller 130. By way of example, the physiological acquisition controller 130 may receive signals from a number of different sensors connected to the patient, such as electrocardiograph (ECG) signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data are lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data are acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 316 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 340. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

Figure 2:
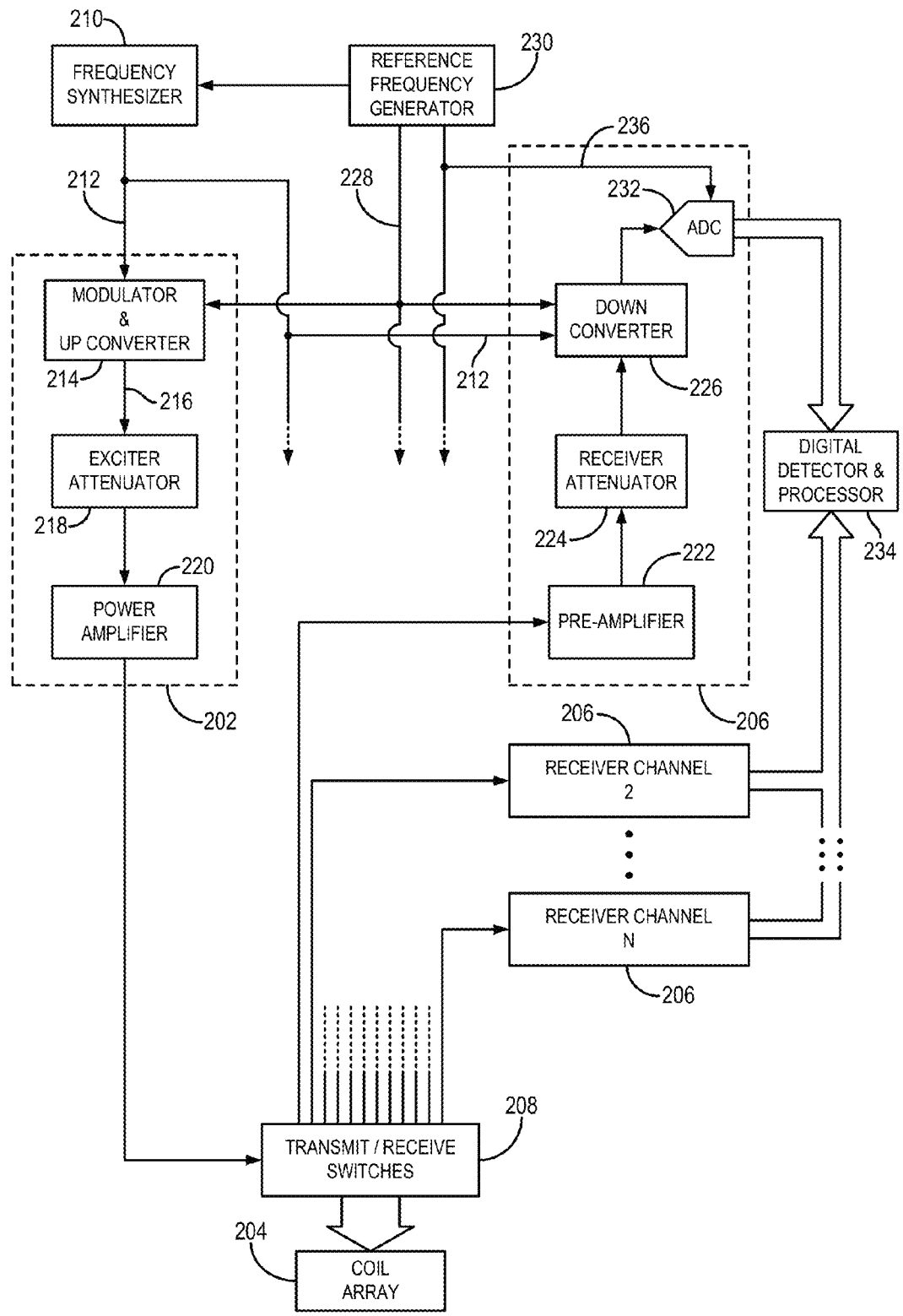
FIG. 2 is a block diagram illustrating an RF system of the MRI system of FIG. 1.

As shown in FIG. 1, the RF system 120 may be connected to the whole body RF coil 128, or as shown in FIG. 2, a transmitter section of the RF system 120 may connect to at least one transmit channel 200 of a coil array 202, and its receiver section may connect to at least one receiver channel 204 of the coil array 202. Often, the transmitter section is connected to the whole body RF coil 128 or a local transmit coil (not shown), and, in so-called receive coil arrays, each receiver section is connected to a separate receiver channel 204.

Referring particularly to FIG. 2, the RF system 120 includes a transmitter that produces a prescribed RF excitation field. The base, or carrier, frequency of this RF excitation field is produced under control of a frequency synthesizer 206 that receives a set of digital signals from the pulse sequence server 110. These digital signals indicate the frequency and phase of the RF carrier signal produced at an output 208. The RF carrier is applied to a modulator and up converter 210 where its amplitude is modulated in response to a signal, R(t), also received from the pulse sequence server 110. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 212 is attenuated by an exciter attenuator circuit 214 that receives a digital command from the pulse sequence server 110. The attenuated RF excitation pulses are applied to a power amplifier 216, which drives the RF coil array 202 through a transmit/receive ("T/R") switch 218.

Referring still to FIG. 2, the signal produced by the subject is picked up by the coil array 202 and applied to the inputs of a set of receiver channels 204. A preamplifier 220 in each receiver channel 204 amplifies the signal by an amount determined by a digital attenuation signal received from the pulse sequence server 110. The received signal is at or around the Larmor frequency, and this high frequency signal is down-converted in a two step process by a down converter 222, which first mixes the detected signal with the carrier signal on line 208 and then mixes the resulting difference signal with a reference signal on line 224. The down converted MR signal is applied to the input of an analog-to-digital ("A/D") converter 226 that samples and digitizes the analog signal and applies it to a digital detector and signal processor 228 that produces 16-bit in-phase values and 16-bit quadrature values corresponding to the received signal. The resulting stream of digitized I and Q values of the received signal are output to the data acquisition server 112. The reference signal, as well as the sampling signal applied to the A/D converter 226, are produced by a reference frequency generator 230.

A system and method for accelerated magnetic resonance imaging is provided. The method makes use of an external calibration process to permit undersampled acquisitions and accelerate the overall process of spatial encoding in the presence of spatially dependent off-resonance. As will be described, the method of the present disclosure exploits the use of a calibration acquisition covering a broad spectrum of frequencies. This calibration significantly reduces total acquisition time by not requiring fully sampled calibration regions for all other acquisitions at different resonance frequency offsets.

The systems and methods described herein are particularly useful in a variety of settings, for example, including accelerated imaging of subjects including a metal implant. The precessional frequency of nuclear spins is proportional to the local magnetic field, $B_0$, which ideally is spatially independent, or homogeneous, over all space. When the precessional frequency remains spatially independent, spatial encoding of magnetic resonance signals can be achieved by manipulating the phase and frequency of the spins as a function of position using linear magnetic gradient fields. However, the precessional frequency is not always solely dependent on its spatial location in the magnetic field of an MRI system. Differences in magnetic susceptibility in an imaging volume result in perturbations in the $B_0$ field, also referred to as magnetic field inhomogeneities that cause spins to precess at off-resonance frequencies. For example, the magnetic susceptibility of a metallic implant is significantly different from the magnetic susceptibility of the surrounding tissue. As a result inhomogeneities in the $B_0$ field are induced, which are spatially dependent based on proximity to metal. These $B_0$ inhomogeneities change rapidly over space and cannot be compensated for with active field shimming.

Metallic implants induce spatially dependent magnetic field inhomogeneities thereby causing spatially dependent off-resonant precessional frequencies. These off-resonance effects distort images acquired using conventional spatial-encoding mechanisms, which makes imaging in the presence of off-resonance difficult. For example, during frequency encoding and slice selection, the relationship between frequency of an acquired magnetic resonance signal and its spatial position becomes ambiguous. This can lead to nonlinear slice profiles as well as signal void and pile-up in areas of off-resonance. The off-resonance produced by foreign objects, such as a metallic implant, depends on the position, size, shape, orientation, and magnetic susceptibility of the object. The off-resonance produced by these metallic objects is, therefore, spatially dependent. When multiple acquisitions are acquired at different resonance frequency offsets, each acquisition will excite and encode a spatially unique portion of the imaging volume.

Figure 3:
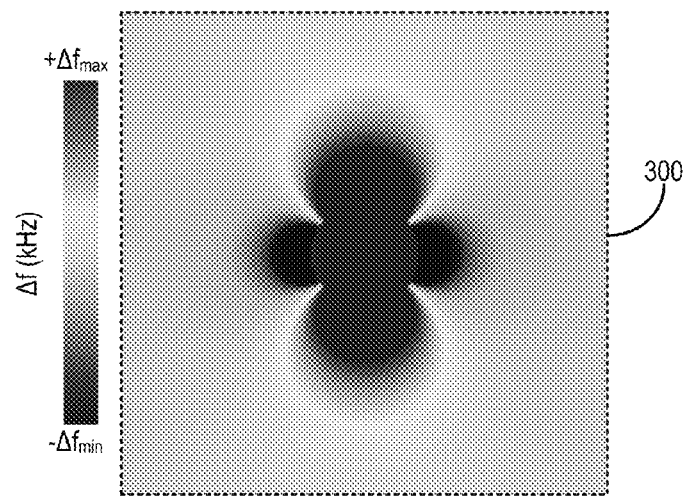
FIG. 3 is an image showing an example of a calculated magnetic field map that illustrates the magnetic field inhomogeneities produced by the presence of a metallic sphere.
Figure 4:
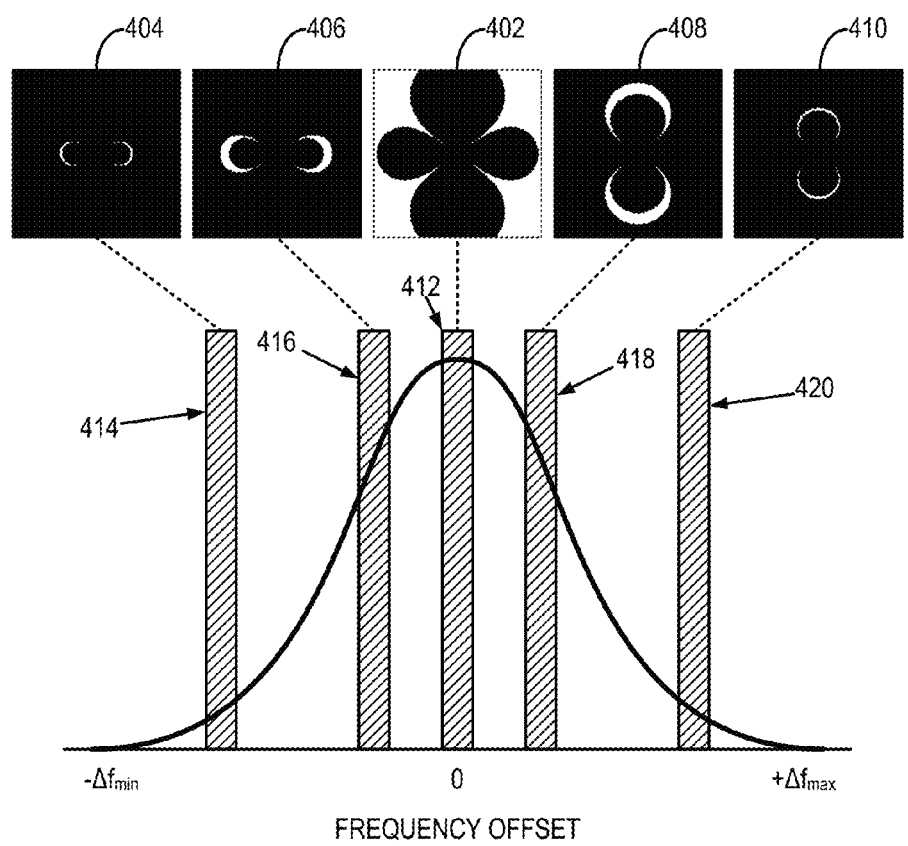
FIG. 4 is a graph and images showing an example of an off-resonance frequency distribution and associated spectral bin images from different frequency ranges having associated spatial locations surrounding a metallic sphere.

Referring now to FIG. 3, the spatial dependence of off-resonance is illustrated in the simulated $B_0$ field map 300 calculated in the presence of a metallic sphere, such as a titanium or stainless steel sphere. Referring now to FIG. 4, images 402-410 for five possible different spectral bins 412-420 are illustrated. The images, 402-410 are instructive for understanding the ability to spatially-encode magnetic resonance signals using multiple acquisitions at different resonance frequency offsets. For example, the image 402 corresponding to the resonance frequencies of spectral bin 412 depicts that the sphere causes nearby frequencies to be spatially dependent. Thus, only the white regions in the periphery of the image 402 will be excited by an RF pulse having the spectral characteristics of spectral bin 412. Likewise, it can be seen that images 404, 406, 408, 410 each depict a unique spatial distribution of off-resonances corresponding to spectral bins 414, 416, 418, 420, respectively.

Each spectral bin image represents the signal obtained from a spatially unique portion of the image volume. As will be described, the present disclosure provides a method to reduce spatial encoding and thereby accelerate image acquisitions using external calibration image data in combination with the spectral bin image data.

Figure 5:
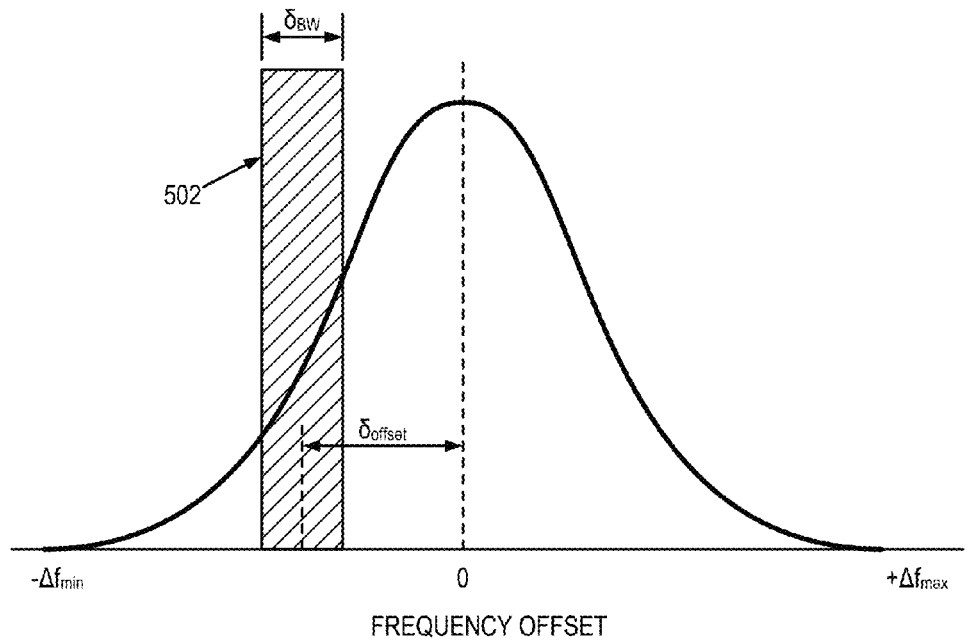
FIG. 5 is a graph illustrating an example spectral bin and its defining relative position and spectral bandwidth.

Referring to FIG. 5, spectral bin data can be used to reconstruct magnetic resonance signals acquired from a defined frequency offset, $\delta_{offset}$, and bandwidth, $\delta_{BW}$. Together, the frequency offset, $\delta_{offset}$, and bandwidth, $\delta_{BW}$, may define a spectral bin 502. MRI pulse sequences that acquire data at multiple different resonance frequency offsets provide images that represent magnetic resonance signals within specific spectral bins.

MRI acquisitions can be accelerated using parallel MRI (PMRI) techniques. PMRI techniques accelerate image acquisition by intentionally skipping (undersampling) some of the data. By using multiple surface coils and their known coil sensitivities, the non-uniform receive profile of each RF coil in an array of coils, the missing data can be reconstructed.

To utilize the RF coil sensitivities in this manner, one must determine the coil sensitivities, typically by creating a map or estimation of the coil sensitivities. Many techniques use self-calibrated techniques. Such self-calibrated techniques fully sample the central portions of k-space, and undersample the periphery, with each acquisition to allow estimation of the RF coil sensitivities. This fully-sampled center portion of k-space is typically referred to as a calibration region.

Figure 6:
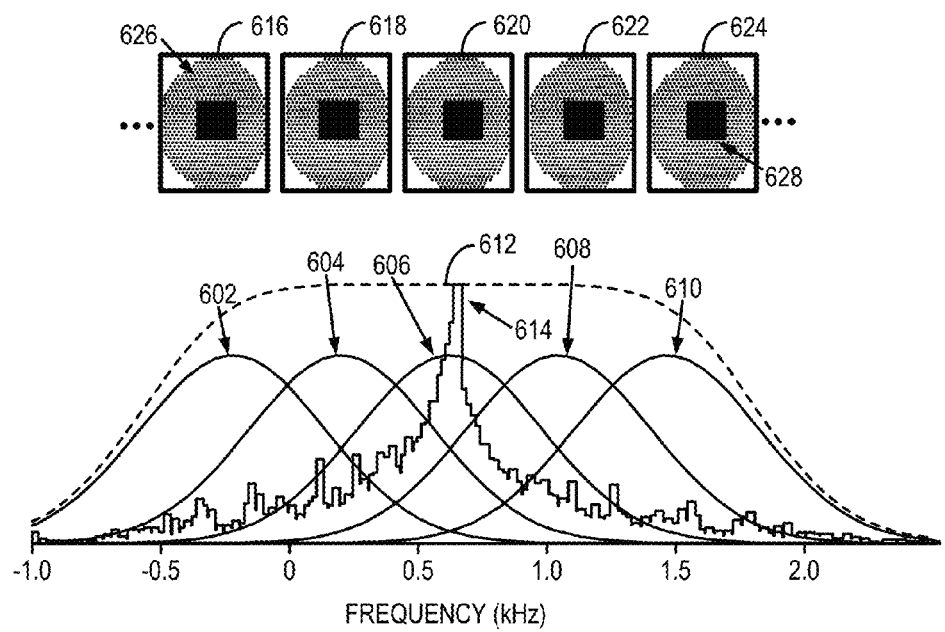
FIG. 6 is a graphic illustration of an example for imaging the combined spectral response (dotted line) of multiple different radio frequency excitation pulses (solid lines) each having a different center frequency to excite the full spectrum of frequencies caused by susceptibility differences.

For example, referring to FIG. 6, an example of acquiring five different RF excitation pulses are used to excite five spectral ranges. The Gaussian spectral response profiles 602-610 for these excitation pulses provide an effective excitation over a wide band 612 of off-resonance frequencies in separate acquisitions, thereby covering the off-resonance frequency distribution 614 in this example. The off-resonance frequency distribution 614 includes the full spectrum of frequencies caused by susceptibility differences. Acquisitions using the different RF excitation pulses produce images of their respective spectral bins.

For each spectral response profile 602-610, a corresponding k-space acquisition 616-624 must be performed. As described, the periphery of each 626 may be undersampled, which yields acceleration. However, when performing such an acquisition using an accelerated imaging technique including a self-calibrated technique, the center of k-space/calibration region 628 must be fully sampled.

The present disclosure recognizes that, in the context of imaging near metallic implants, self-calibrated approaches unfavorably require that calibration regions 628 be acquired for all RF frequency offsets. The acquisition of these calibration regions 628 for all of the RF frequency offsets 602-610 is time-consuming. This problem is exacerbated when moving to fully phase-encoded methods.

With this in mind, the above-described systems and method can be can be extended in accordance with the present disclosure to perform accelerated imaging near metallic implants without the undesirable delays imparted by the need to acquire calibration regions for all of the RF frequency offsets. Rather, referring to FIG. 7, the present disclosure may use a separate, low-resolution scan over a wide spectrum of resonance frequencies to estimate the coil sensitivity for all frequencies or a wide range of frequencies. That is, as will be described, coil sensitivity may be estimated over a very-broad range of off-resonance to reduce the acquisition time of frequency encoded 3D multi-spectral imaging (3D-MSI), including pulse sequences such as MAVRIC, and/or fully-phase encoded methods, including pulse sequences such as spectrally-resolved, fully phase-encoded ("SR-FPE"), as described in co-pending U.S. patent application Ser. No. 14/161,308, which is incorporated herein by reference in its entirety by not acquiring calibration regions for all spectral bins.

Figure 7:
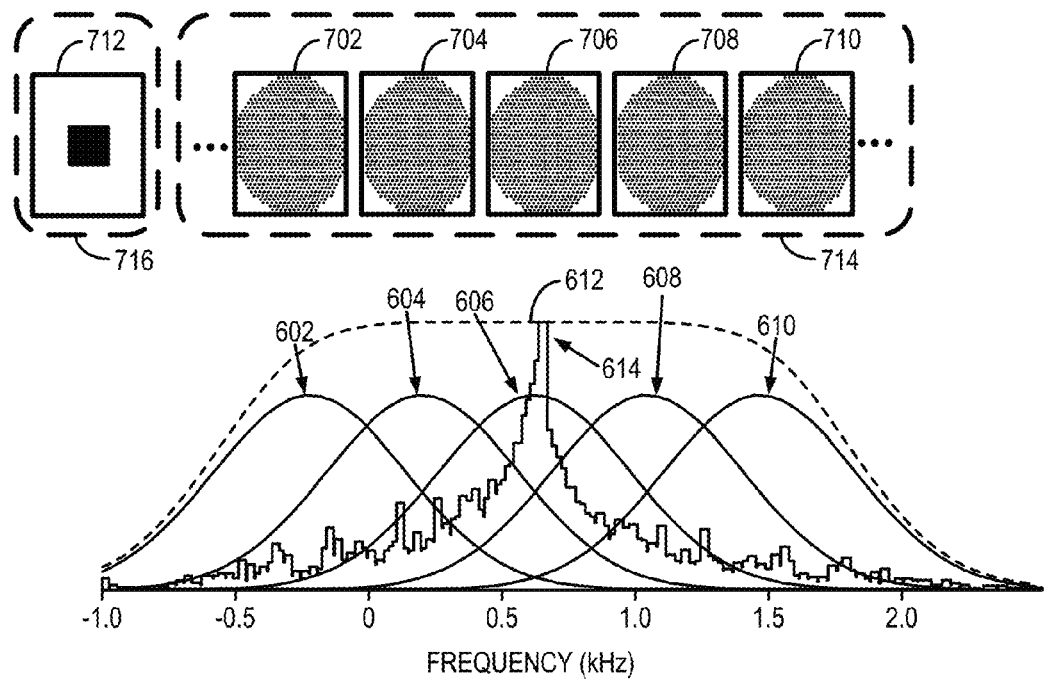
FIG. 7 is a graphic illustration of an example similar to that of FIG. 6, but illustrating an example for imaging that utilizes an external calibration process that can estimate coil sensitivity over a broad range of off-resonance.

As shown in FIG. 7, the above-described example of acquiring five different RF excitation pulses to excite five spectral ranges is again illustrated. Again, the Gaussian spectral response profiles 602-610 for these excitation pulses provide an effective excitation over a wide band 612 of off-resonance frequencies in separate acquisitions, thereby covering the off-resonance frequency distribution 614 in this example. The off-resonance frequency distribution 614 includes the full spectrum of frequencies caused by susceptibility differences.

For each spectral response profile 602-610, a corresponding k-space acquisition 702-710 is performed. However, unlike the acquisition described above with respect to FIG. 6, undersampling in these acquisitions 702-710 is not limited to the periphery. Rather, the entire acquisition of k-space in each instance 702-710 may be undersampled, including the center of k-space. To allow the entire acquisition of k-space in each instance 702-710 to be undersampled, including the center of k-space, the present disclosure provides external calibration. That is, a single, fast calibration acquisition 712 is performed that is separate from the k-space acquisitions used to acquire the imaging data for many spectral bins 702-710.

As such, the imaging pulse sequence can be conceptualized as including two distinct sub-portions. The first sub-portion the above-described imaging acquisition 714, which is an undersampled acquisition of k-space to acquire image data 702-710 for all of the spectral bins, each of which may notably undersample the center of k-space. The second sub-portion is a calibration acquisition 716 that acquires calibration data about the coil sensitivities and is external to the imaging acquisition. By separating the calibration acquisition 716 from the imaging acquisition 714, the present disclosure significantly reduces acquisition times by not requiring the acquisition of fully sampled calibration regions for each sampling 702-710 for each of the spectral bins 602-610. Rather, the present disclosure provides a system and method for simultaneously acquiring coil sensitivity maps for all spectral bins, or frequency offsets.

Figure 8:
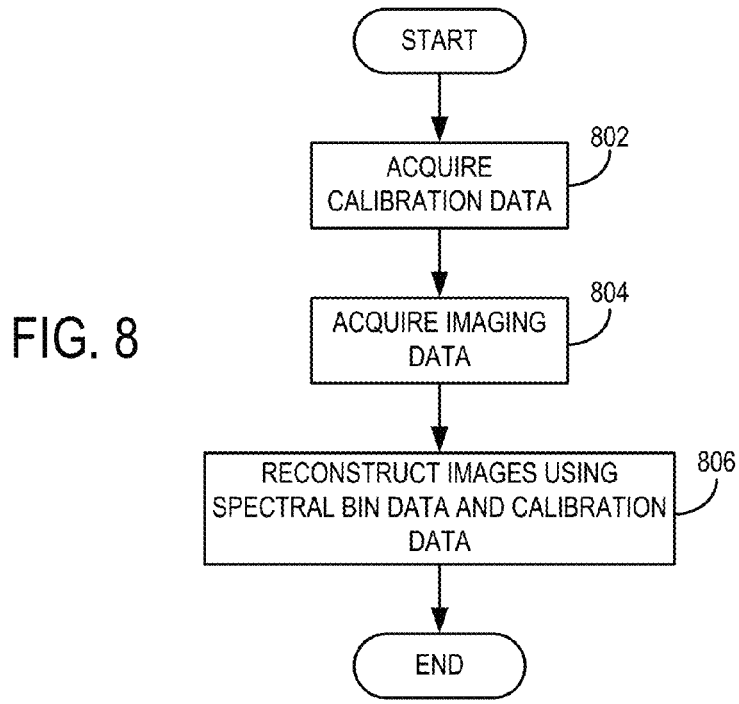
FIG. 8 is a flowchart setting forth the steps of a method for magnetic resonance imaging that makes use of the imaging process illustrated in FIG. 7.

Referring now to FIG. 8, a flowchart setting forth the steps of an example of a method for magnetic resonance imaging that implements accelerated spatial-encoding for multiple spectral bins is illustrated. The method begins with the acquisition of calibration data at process block 802 using a single, external calibration acquisition. To achieve a single calibration acquisition, such as illustrated by the calibration acquisition 716 of FIG. 7, that provides the required calibration data needed to reconstruct the image data acquired during the imaging acquisition 714, calibration acquisition 716 may preferable be an ultra-broadband excitation, such that the entire spectrum of off-resonance signal is excited. As one non-limiting example, the excitation may have a bandwidth of approximately 80 kHz. However, this would result in a longer echo time than a greater bandwidth of, for example, 150 kHz. Thus, this tradeoff between minimum achievable echo-time and RF bandwidth can be balanced for a desired application. Furthermore, the excitation used during the calibration acquisition at process block 802 of FIG. 8 may use a low flip angle, hard RF pulses that cover the desired bandwidth of off-resonant frequencies. As one non-limiting example, the flip angle may be 3 degrees. Furthermore, the calibration acquisition may forego frequency encoding to prevent in-plane distortions in coil sensitivities and utilize a short echo time to control signal loss near metal due to fast T2* decay. As non-limiting examples, a pulse sequence configured to have a very-short echo time may include the single-point ramped imaging with T1 enhancement ("SPRITE") pulse sequence, the sweep imaging with Fourier transformation ("SWIFT") pulse sequence, or single point variants of other ultra-short TE methods.

Thereafter, at process block 804, k-space data are acquired for all the spectral bins. After k-space data has been acquired for the calibration and all the spectral bins, parallel imaging is performed to estimate k-space points that were not acquired in the spectral bins. By way of example, this spectral bin data may include temporal sampling allowing the formation of spectral images. A spectral bin image generally depicts the spatial distribution of resonance frequencies, or off-resonance frequencies, in an image field-of-view. For example, a spectral bin image may have pixels whose values indicate the spatial location of a region in the field-of-view in which spins precess at a given frequency or range of frequencies defined by a spectral bin.

After the spectral bin data are produced, it is used, along with the calibration data acquired at process block 802, to reconstruct one or more images of the subject from the acquired k-space data, as indicated at step 806. Image reconstruction may proceed using an image reconstruction technique that traditionally makes use of coil sensitivities. By way of example, a SENSE-based reconstruction algorithm, a GRAPPA-based reconstruction algorithm, a SPIRiT-based reconstruction algorithm, an ARC-based reconstruction algorithm, or other such algorithms may be used.

The present disclosure recognizes that, when using multiple off-resonance excitations to excite the entire signal, eventually images acquired at different off-resonance frequencies will need to be combined together. To this end, all the spectral bin images can be added together to form a composite image. One of the challenges of recombining the image data sets is that the phase of the image may be inconsistent, leading to errors when recombining complex data. Having a coil sensitivity map that spans all frequency offsets, and therefore is shared by all off-resonance bins, can be used to help avoid recombination errors and the image quality of the final recombined images.

To demonstrate the effectiveness of the above-described systems and methods for accelerating SR-FPE acquisitions using external calibration, consider the example of 2 mm isotropic knee acquisition with imaging parameters, image acceleration parameters, and acquisition times outlined in Table I.

TABLE I

| Imaging Parameter | Self Calibrated | Externally Calibrated |
|---|---|---|
| Resolution (mm) | 2 × 2 × 2 | |
| Field of View (cm) | 20 × 10 × 10 | |
| Echo Spacing (ms) | 6.5 | |
| # of spectral bins | 24 | |
| PMRI Outer Acceleration Factor | 3 × 2 × 2 | |
| Calibration Region | 25 × 25 × 25 | N/A |
| External Calibration Acquisition Time (s) | N/A | 10 |
| Net Acceleration Factor | 10 | 23 |
| Total Acquisition Time (min) | 65 | 28 |

For a 25×25×25 calibration region at 24 spectral bins, 375000 data points were acquired to estimate the coil sensitivities. With an echo spacing of 6.5 ms, it took approximately 40 minutes just to estimate the coil sensitivity. By using external calibration the entire region of k-space can be heavily under sampled. As illustrated in Table I, undersampling by a factor of 12 reduced the time required to acquire the central region of k-space from approximately 40 minutes to approximately 3 minutes. In total, moving from self-calibrated to externally calibrated PMRI with the same outer acceleration factor reduced the acquisition time from 65 minutes to 28 minutes. Based on an initial implementation, the calibration acquisition required for the externally calibrated PMRI is approximately 10 s.

The above-described tested and estimated improvements in acquisition times using the systems and methods for externally calibrated PMRI of the present disclosure do not include additional scan time reductions that are possible by utilizing off-resonance encoding (ORE) and or multiband techniques. As described in the above-incorporated co-pending application and Smith, M. R., Artz, N. S., Koch, K. M., Samsonov, A. and Reeder, S. B. (2014), Accelerating sequences in the presence of metal by exploiting the spatial distribution of off-resonance. Magn Reson Med, 72: 1658-1667. doi: 10.1002/mrm.25087, the spectral bin data provide an ability to accelerate image acquisitions using this spatially-dependent spectral sensitivity information and a common or external calibration image. This can be achieved because the spatial dependence of off-resonance that occurs for spins precessing in the presence of magnetic field inhomogeneities can be used to provide spatially-dependent spectral sensitivity information. Each of the spectral bin images provides spatially-dependent sensitivity information that is analogous to the sensitivity profile of an RF receiver coil. Conventional parallel imaging exploits the spatial sensitivities of independent receiver coils to accelerate acquisitions. In the presence of susceptibility-induced off-resonance, the spatial information of spectral sensitivity can also be independently exploited to accelerate acquisitions.

That is, the above-described systems and methods may be extended to systems and methods for spectrally-resolved three-dimensional magnetic resonance imaging, in which multiple different spectral bands associated with multiple different spectral bins are simultaneously excited using a multiband excitation scheme. The magnetic resonance signals generated in response to this excitation are then spatially encoded using phase-encoding along three spatial dimensions (i.e., no frequency-encoding gradients are used). As such, the imaging technique can be referred to as being multiband, fully phase-encoded ("MB-FPE") imaging.

Multiband imaging techniques have been previously applied to simultaneous multislice acquisitions, as described, for example, by S. Wüller in "Multifrequency Selective RF Pulses for Multislice MR Imaging," *Magn Reson Med*, 1988; 6: 364-371. Multiband imaging has also been applied to hyperpolarized carbon-13 MRI to simultaneously excite and acquire multiple metabolic components, as described, for example, by P. Larson in "Multiband excitation pulses for hyperpolarized $^{13}$C dynamic chemical-shift imaging," *Magn Reson Med*, 2008; 194(1):121-127. In these previous examples, and all prior uses of a multiple-band RF excitation, frequency encoding was utilized during the acquisition. Spatial distortion resulting from frequency encoding in these cases is considered sub-pixel because of the relatively small off-resonance of hundreds of Hertz (Hz) within the imaging volume.

When imaging near metallic implants with frequency encoding, however, the metal can induce extreme off-resonance. If different frequency bands are excited near metal using multiband excitation, the metal-induced off-resonance bands will remain off-resonant throughout frequency encoding which destroys the spatial encoding process and leads to significant undesirable image artifacts. Thus, current methods for imaging near metal, such as MAVRIC and SEMAC, which make use of frequency-encoding gradients have been limited to using single band excitation RF pulses.

The systems and methods of the present disclosure make use of multiband excitation to accelerate imaging near metal, which is more straightforward when frequency encoding is eliminated and FPE spatial encoding techniques are implemented instead, as described in Artz N S, Smith M R, Reeder S B. Multiband RF Excitation for Accelerating Magnetic Resonance Imaging in the Presence of Metal. Proceedings of the 22nd Annual Meeting of the International Society for Magnetic Resonance in Medicine, Milan, Italy, 2014, 650.

In general, the following systems and methods allow for independent and highly customizable sampling of k-space. Each spatially-encoded magnetic resonance signal can be sampled at multiple time points, thereby providing the acquisition of spectrally-resolved data. Because each magnetic resonance signal is independently sampled, a significant gain in SNR can be achieved over many existing imaging techniques. In addition, spectral data can be efficiently acquired at spatial resolutions common to conventional MRI techniques.

This may be implemented using any number of different pulse sequences. For example, the method of the present invention may be implemented in a three-dimensional pulse sequence that samples a magnetic resonance signal in the form of a free-induction decay, spin echo, or stimulated echo. Additionally, the present invention may be implemented using a three-dimensional pulse sequence that utilizes coherent transverse magnetization from one repetition time period to the next, including gradient-recalled acquisition in the steady-state ("GRASS"), spoiled gradient echo ("SPGR"), spin-echo ("SE"), and steady-state free precession ("SSFP") pulse sequences.

Figure 9:
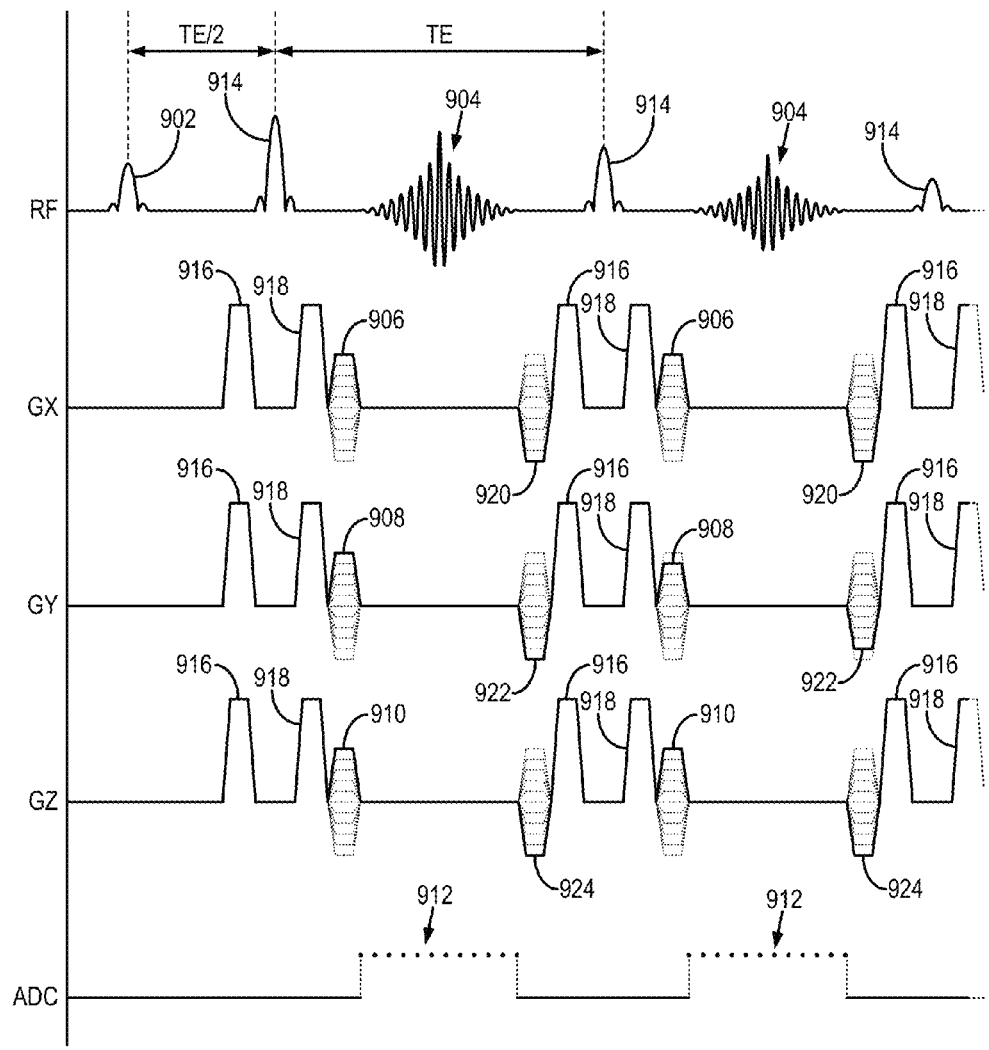
FIG. 9 is an example of a pulse sequence that phase-encodes a magnetic resonance signal, such as spin-echo and stimulated-echo signals, in three dimensions and that does not include a frequency-encoding gradient.

By way of example, a three-dimensional pulse sequence that acquires k-space data by sampling spin-echo magnetic resonance signals is illustrated in FIG. 9. Such a pulse sequence may include a spectrally-resolved fast spin-echo pulse sequence. Because, in this pulse sequence, no frequency-encoding gradient is played out during the formation of the magnetic resonance signal, frequency-encoding-related shift artifacts are avoided. By way of further example, the pulse sequence may include using an excitation scheme with extended refocusing trains using modulated flip angles, an example of which is described by R. F. Busse, et al., in "Fast Spin Echo Sequences with Very Long Echo Trains: Design of Variable Refocusing Flip Angle Schedules and Generation of Clinical T2 Contrast," *Magnetic Resonance in Medicine*, 2006; 55(5): 1030-1037.

Referring specifically to FIG. 9, an example of a pulse sequence for acquiring three-dimensional k-space data with a multiband excitation that excites multiple different spectral bands and without the use of a frequency-encoding gradient is illustrated. In this example, the pulse sequence is a three-dimensional fast-spin echo pulse sequence. The pulse sequence includes the application of a multiband radio frequency ("RF") excitation pulse 902 that acts to rotate net magnetization from multiple different spectral bins about an axis. For instance, the multiband RF excitation pulse 902 is configured to rotate net magnetization about a rotation axis into a transverse plane such that the net magnetization is converted from longitudinal magnetization into transverse magnetization in each of the excited spectral bins.

As one example, the multiband RF excitation pulse 902 can be designed to simultaneously excite three frequency bands with different center-frequency offsets, such as: −4000 Hz, 0 Hz, and 4000 Hz (i.e., one frequency band on-resonance and two frequency bands that are off-resonance with a ±4000 Hz offset). To reduce the peak $B_1$ of the multiband RF excitation pulse 902, a temporal phase difference, temporal shift, or both can be added to one of the three frequency bands prior to summing.

After the multiband RF excitation pulse 902 is applied, an RF refocusing pulse 914 is applied in order to refocus dephasing of the transverse magnetization and to form spin-echo magnetic resonance signals 904. The RF refocusing pulse 914 is preferably a multiband RF pulse designed to refocus spins in the same multiple spectral bins that were excited by the multiband RF excitation pulse 902. In a pulse sequence where multiple spin-echoes are generated for each RF excitation, it may be advantageous to modulate the flip angle of subsequent RF refocusing pulses 914.

The magnetic resonance signals 904 are spatially-encoded by the application of three phase encoding gradients 906, 908, 910. The first phase-encoding gradient 906 is applied along a first direction, such as the x-direction. The second phase-encoding gradient 908 is established concurrently with the first phase-encoding gradient 906 and is applied along a second direction, such as the y-direction, that is orthogonal to the first direction. The third phase-encoding gradient 910 is established concurrently with the first and second phase-encoding gradients 906, 908 and is applied along a third direction, such as the z-direction, that is orthogonal to the first and second directions. Together, the three phase-encoding gradients 906, 908, 910 spatially-encode the magnetic resonance signals 904. For example, the three phase-encoding gradients 906, 908, 910 define a single point in three-dimensional k-space at which the magnetic resonance signals 904 will be sampled during a data acquisition window 912. Each magnetic resonance signal 904 may be symmetrically sampled through time to provide spectral decomposition and high SNR performance.

To help ensure that the magnetic resonance signals are in-phase, crusher gradients 916 may be applied before each RF refocusing pulse 914. These crusher gradients 916 act as pre-winders. To mitigate free-induction decay signals generated by the RF refocusing pulse 914, crusher gradients 918 may also be applied after the RF refocusing pulse 914. These crusher gradients 916, 918 may not be needed when only a single spin-echo is sampled following RF excitation. It is noted that although the crusher gradients 918 and phase encoding gradients 906, 908, 910 are shown as distinct gradient pulses, in practice these gradient may be combined. After each magnetic resonance signal 904 is formed and sampled, rewinding phase-encoding gradients 920, 922, and 924 are generated before spatially-encoding the next magnetic resonance signals in the echo train.

The echo train of this pulse sequence is repeated a plurality of times and during each repetition one or more of the three phase-encoding gradients 906, 908, 910 is changed so that a different point in three-dimensional k-space is sampled for each subsequent magnetic resonance signal 904 formed in the echo train. By way of example, the amplitude of the three phase-encoding gradients 906, 908, 910 may be stepped through a plurality of values such that k-space is sampled in a sampling pattern defined by the amplitudes of the phase-encoding gradients 906, 908, 910.

In some embodiments, each point in k-space can be repeatedly sampled over a period of time when the magnetic resonance signals 904 are generated. As a result the sampling used in these embodiments, each sampled point in k-space will contain information for N different images, where N is the number of time points at which the magnetic resonance signals 904 are sampled at any given point in k-space. This independent sampling yields a significant gain in SNR and can also provide unique spectral information. This spectral information can be used to separate the multiple RF frequency bands (excited using an MB pulse) via digital filtering and/or spectral decomposition. Although MB imaging requires a larger receiver bandwidth during acquisition, subsequent signal modeling of the spectral data can yield SNR comparable to a single RF band acquisition with a lower receive BW, in which data would be acquired with a smaller receiver bandwidth. It is also contemplated that this SNR enhancement can facilitate other acceleration mechanisms, such as the off-resonance encoding discussed and referenced above.

When a multiband excitation is used to acquire signals for each of N different frequency bands in a single acquisition, an N-fold reduction in scan time may be achievable. As noted above, as one example, N may equal three, meaning that three different frequency bands can be acquired in a single acquisition. It should be noted that additional techniques can also be implemented to accelerate data acquisition. For example, corner cutting in three dimensions can be used to accelerate data acquisition by not sampling the corner regions of k-space, thereby providing R=2 acceleration. Further, if parallel imaging techniques are utilized in all three phase-encoded dimensions, even greater acceleration factors can be achieved. As one example, with three-fold acceleration in the x-direction, and two-fold acceleration in the y-direction and z-direction, a net acceleration factor of R=3×2×2=12 is feasible. Coupling a multiband acquisition with an R=2 acceleration from corner cutting, described above, and an R=12 acceleration using parallel imaging in three dimensions, also described above, a total acceleration of R=3×2×12=72 may be achievable.

Data acquired with pulse sequences that implement the present invention can be reconstructed to produce images of the subject using existing image reconstruction techniques. For example, when data are acquired by sampling k-space at points that lie on a three-dimensional Cartesian grid, images can be reconstructed using a conventional Fourier transform ("FT") approach. Other image reconstruction techniques may also be used depending on the choice of k-space sampling pattern. For example, backprojection methods, regridding methods with subsequent FT, compressed-sensing based methods, and parallel image reconstruction methods, such as GRAPPA, SPIRiT, ARC, and the like may be used.

Pulse sequences that implement the present invention can use a standard FT applied along the time dimension on a voxel-by-voxel basis to produce spectroscopic images. Alternatively, signal modeling can be used to estimate the proton density, $\rho$; transverse magnetization relaxation rate, $R^*_2$; and $B_0$ field map, $\psi$, at each voxel. This signal model can also incorporate multiple chemical species, thereby allowing for separation of the signal contributions of the chemical species, such as in water-fat separation. A magnetic resonance signal for a single chemical species can be modeled as:

$$S_n(r) = \rho(r)e^{-R_2^*(r)|t_n|}e^{i2\pi\psi(r)t_n}; \quad (3)$$

and a magnetic resonance signal for M different chemical species can be modeled as:

$$S_n(r) = e^{i2\pi\psi(r)t_n}\sum_{m=1}^{M}\rho_m(r)e^{i2\pi\Delta f_m(r)t_n}e^{-R_{2,m}^*(r)|t_n|}; \quad (4)$$

where $S_n(r)$ is the signal measured for a voxel, r; $t_n$ is the time of a sample, n, relative to the spin-echo or the start of the free-induction decay; $\rho(r)$ is proton density at the voxel, r; $\Delta f$ is the frequency offset from water; and $\psi(r)$ represents the magnetic field, $B_0$, at the voxel, r. Using a non-linear least squares, or other, curve fitting algorithm, $\rho(r)$, $\psi(r)$, and $R^*_2(r)$ can be estimated from equations (3) or (4).

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
    a magnet system configured to generate a static magnetic field about at least a bore of the MRI system;
    a plurality of gradient coils configured to apply a gradient field to the static magnetic field;
    a radio frequency (RF) system including an array of coils configured to apply an excitation field and acquire MR image data therefrom;
    a computer system configured to:
        control the RF system to acquire coil calibration data from a subject including a material causing inhomogeneities in the static magnetic field when arranged in the bore of the MRI system;
        after acquiring the coil calibration data, control the RF system to acquire imaging data with from the subject;
        analyze the imaging data to generate spectral bin data with respect to a plurality of spectral bins, wherein the spectral bin data relates specific resonance frequencies to distinct spatial locations in the static magnetic field of the MRI system; and
        reconstruct an image of the subject from the imaging data using the coil calibration data and the spectral bin data to provide spatial encoding of the image for each spectral bin.

2. The system of claim 1 wherein, to acquire the imaging data, the computer system is configured to undersample a center of k-space and a periphery of k-space.

3. The system of claim 1 wherein, to acquire the coil calibration data, the computer system is configured to fully sample a center of k-space.

4. The system of claim 1 wherein, to generate the spectral bin data, the computer system is configured to produce a plurality of images at different resonance frequencies using the calibration data and the spectral bin data, each of the plurality of images depicting spatial locations within an imaging field-of-view of the MRI system that are associated with a particular spectral response.

5. The system of claim 4 wherein the particular spectral response is a range of resonance frequencies that are off-resonance because of the inhomogeneities in the static magnetic field of the MRI system.

6. The system of claim 1 wherein, to acquire the imaging data, the computer system is configured to:
    i) apply a radio frequency (RF) excitation pulse having a center frequency and a spectral bandwidth;
    ii) acquire an imaging data set following the application of the RF excitation pulse; and
    iii) repeating steps a)i) and a)ii) a plurality of times to acquire the imaging data while changing at least one of the center frequency and the spectral bandwidth of the RF excitation pulse during each repetition of step i).

7. The system of claim 6 wherein, to generate the spectral bin data, the computer system is configured to reconstruct a spectral bin image from each imaging data set and wherein each spectral bin image depicts spatial locations within an imaging field-of-view of the MRI system that are associated with resonance frequencies in a spectral band defined by the center frequency and spectral bandwidth of the RF excitation pulse associated with the k-space data set from which the spectral bin image was reconstructed.

8. The system of claim 6 wherein for each repetition of ii), the computer system is further caused to sample k-space with a different sampling pattern.

9. The system of claim 8 wherein the computer system is further caused to select each different sampling pattern to adjust at least one of a center frequency and spectral bandwidth of the RF excitation pulse associated with the imaging data set being acquired.

10. The system of claim 1 wherein the computer system is further caused to control the gradient system to apply a magnetic field gradient to amplify the inhomogeneities in the magnetic field.

11. A method for acquiring imaging data from multiple different resonance frequency offsets with a magnetic resonance imaging (MRI) system, the method including steps comprising:
    a) acquiring coil calibration data using a coil array positioned for imaging with respect to a subject having a material causing inhomogeneities in a static magnetic field of the MRI system;
    b) separately from acquiring the coil calibration data, acquiring imaging data from the subject across a plurality of different resonance frequency offsets corresponding to respective spectral bins;
    c) deriving spectral bin images from the imaging data, wherein the spectral bin images relate specific resonance frequencies to distinct spatial locations in the static magnetic field of the MRI system; and
    d) reconstructing spectral bin images of the subject from the imaging data using coil calibration data and the spectral bin images to provide spatial encoding of the spectral bin images.

12. The method of claim 11 wherein step b) includes:
    i) producing a multiband radio frequency (RF) pulse or a single-band pulse that excites spins associated with each of the plurality of different resonance frequency offsets;
    ii) establishing a first phase-encoding gradient along a first direction;
    iii) establishing a second phase-encoding gradient along a second direction that is orthogonal to the first direction;

iv) establishing a third phase-encoding gradient along a third direction that is orthogonal to the first direction and the second direction; and v) acquiring data at a point in k-space that is defined by the first, second, and third phase-encoding gradients by sampling a magnetic resonance signal during a period of time in which no magnetic field gradients are established by the MRI system.

13. The method of claim 12 wherein the plurality of different resonance frequency offsets includes an on-resonance RF offset and at least one off-resonance RF offset.

14. The method of claim 12 further comprising producing a multiband or single band refocusing RF pulse that refocuses magnetization attributable to the excited spins associated with each of the plurality of resonance frequency offsets so as to form the magnetic resonance signal as a spin-echo at an echo time.

15. The method of claim 12 wherein the magnetic resonance signal includes a free-induction decay signal, a spin-echo signal, or a stimulated echo signal.

16. The method of claim 12, further comprising repeating steps i)-v) a plurality of times while each repetition alters at least one of the first, second, and third phase-encoding gradients such that data are acquired from a different point in k-space during each repetition, the different points in k-space defining a k-space sampling pattern.

17. The method of claim 16 wherein the k-space sampling pattern includes undersampling k-space all regions of k-space using at least one of a Cartesian grid, radial lines, spiral trajectories, or randomly distributed in three-dimensional k-space.

18. The method of claim 17 wherein the k-space sampling pattern includes a variable density of sampling points such that different portions of k-space are undersampled with different sampling densities.

19. The method of claim 17 wherein at least a center of k-space is fully sampled to acquire the coil calibration data.

20. The method claim 11 wherein step a) includes generating a coil calibration map that spans the plurality of different resonance frequency offsets.

* * * * *

UNITED STATES PATENT AND TRADEMARK OFFICE
CERTIFICATE OF CORRECTION

| | |
|---|---|
| PATENT NO. | : 9,989,613 B2 |
| APPLICATION NO. | : 14/558374 |
| DATED | : June 5, 2018 |
| INVENTOR(S) | : Curtis N. Wiens et al. |

It is certified that error appears in the above-identified patent and that said Letters Patent is hereby corrected as shown below:

In the Specification

Column 11, Line 54, "Wüller" should be --Müller--.

Signed and Sealed this
Twenty-fourth Day of July, 2018

Andrei Iancu
*Director of the United States Patent and Trademark Office*